United States Patent
Yashiba et al.

(10) Patent No.: US 6,215,345 B1
(45) Date of Patent: Apr. 10, 2001

(54) SEMICONDUCTOR DEVICE FOR SETTING DELAY TIME

(75) Inventors: Yasuo Yashiba; Toshichika Sakai; Takaharu Fujii, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/272,577

(22) Filed: Mar. 19, 1999

(30) Foreign Application Priority Data

Apr. 16, 1998 (JP) ................................................ 10-106073

(51) Int. Cl.[7] ........................................................ H03K 5/13
(52) U.S. Cl. ............................................. 327/279; 327/265
(58) Field of Search ..................................... 327/261, 263, 327/265, 269, 270, 273, 276, 277, 279, 286

(56) References Cited

U.S. PATENT DOCUMENTS

| 5,049,766 | * | 9/1991 | Van Driest et al. | ................. | 327/269 |
| 5,260,608 | * | 11/1993 | Marbot | ................. | 327/263 |
| 5,570,294 | * | 10/1996 | McMinn et al. | ................. | 364/481 |
| 5,774,699 | * | 6/1998 | Nagae | ................. | 395/551 |
| 6,025,745 | * | 2/2000 | Lee et al. | ................. | 327/277 |

FOREIGN PATENT DOCUMENTS

| 3843261A1 | 6/1990 | (DE) . | | |
| 69025422 | 7/1996 | (DE) . | | |
| 1-175408 | 7/1989 | (JP) . | | |
| 4-331507 | * | 11/1992 | (JP) | ................. 327/276 |

* cited by examiner

Primary Examiner—Tuan T. Lam
(74) Attorney, Agent, or Firm—Young & Thompson

(57) ABSTRACT

The semiconductor device for setting a delay time, according to the present invention, comprises: a plurality of serially connected delay circuits into which a reference signal is input; a selector switch for selecting one of delay signals output from connection points between the delay circuits; and an internal selection signal generator for producing a selection signal for switching the selector switch to select one of the connection points.

18 Claims, 8 Drawing Sheets

FIG.8a  c  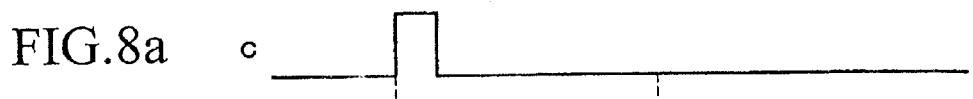
FIG.8b  d  
FIG.8c  d  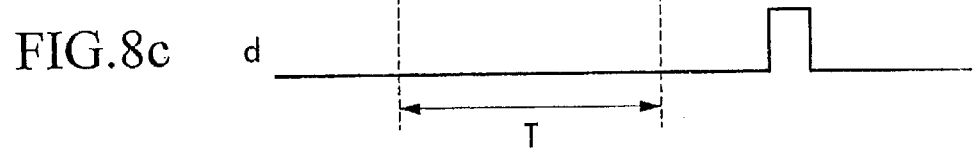
FIG.8d  c  
FIG.8e  d  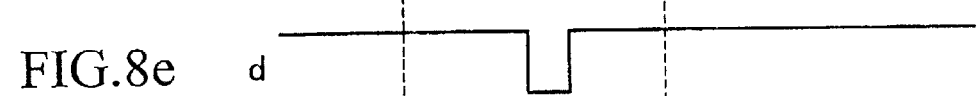
FIG.8f  d  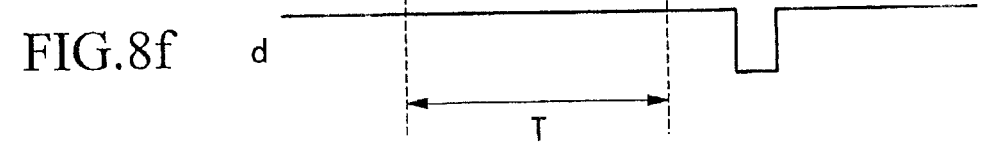
PRIOR ART

SEMICONDUCTOR DEVICE FOR SETTING DELAY TIME

BACKGROUND OF THE INVENTION

1. Field of the Invention

The present invention relates to a semiconductor device and a method for setting a delay time, and in particular to a semiconductor device and a method for setting a delay time which can adjust a timing of outputting a signal.

This application is based on Japanese Patent Application No. 10-106073, the contents of which are incorporated herein by reference.

2. Description of the Related Art

In recent years, MPUs (Micro Processing Units) and logic circuits connected thereto have come to operate at a significantly high speed, and are required to operate in general at 100 to 300 MHz. Signals from these MPUs are generated based on a clock signal, whose period is 3 to 10 ns, and which will be required to have an even higher frequency in the future.

When a signal is transferred through a logic gate, a delay time may be irregular because the transfer speed, which corresponds to the delay time, may be altered because of irregularities in manufacturing transistors of the logic gate (irregularity in threshold voltages Vt defining the performances of the transistors or in the gate lengths L), in drive performance, in unwanted capacities which lead to loads, in operation temperatures, and in operation voltages. Because of the irregularity in delay time, inaccurate data may be latched or results of the logical operation may become inaccurate, resulting in abnormal operations of the semiconductor device.

The timing of outputting the signals from the semiconductor device must be within a time defined in a specified standard which relates to periphery devices to be connected. To secure co-operation between the semiconductor devices (devices on a board), a signal from one device must be output within a specified time of period so as to allow the other devices to receive the signal reliably. That is, the signal must be output within a maximum delay time and within a minimum delay time with respect to a reference signal.

When the signal is not within these delay times, the output signal may be changed prior to the reference signal, and the semiconductor device cannot receive the signal or may accidentally receive the next signal. Conversely, when the change in the output signal is delayed, the semiconductor device cannot receive an accurate signal or may receive the previous signal.

In general, semiconductor manufacturers tests their products before shipment to confirm whether timings of output signals satisfy the standard. Although when many inferior products are found, the cost may be undesirably increased, techniques for increasing uniformity in products cannot keep pace with the improvement of the operation speeds of the semiconductor devices. It is therefore difficult to achieve the specified minimum and maximum output delay times only by improving the manufacturing process.

The problem in semiconductor design is how to set the delay time to satisfy the standard even when irregularity in products occurs during the manufacturing process. For example, even when irregularity in delay time is 10 ns in a semiconductor device operating at 10 MHz of clock, it does not matter because the clock cycle is 100 ns. When the clock period is 100 MHz and irregularity in delay time is 10 ns, the device cannot function because the clock period is 10 ns.

Japanese Patent Application, First Publication No. 9-181580, discloses a process for adjusting a delay time by the circuitry design of a semiconductor device. In this background art, the semiconductor device includes a delay circuit in which a plurality of delay gates are serially connected. Each AND gate, which can be opened and closed based on control signals, is provided before a delay gate. Before assembling the system, the delay time is measured, and some of delay gates are set to output signals. Then, delay gates which are not in use are searched, and are set to inhibit transmission of pulses by closing the corresponding AND gates.

FIG. 7 is a block diagram showing a prior delay generation circuit in a semiconductor device of the back ground art, and FIG. 8 is a diagram explaining a problem in a prior measurement process. As shown in FIG. 7, the delay generation circuit 33 in the semiconductor device 32 comprises four delay circuits 12a to 12d, a mode switch 13, a selector switch 14, an output switch 15, and a programable read only memory 17 (hereinafter referred to as PROM).

The semiconductor device 32 has five terminals, which are a reference pulse input terminal 19, an operation mode input terminal 20, an output terminal 21, a write terminal 22, and a selection signal input terminal 27. Through these terminals, a semiconductor tester 23 is connected to the semiconductor device 32. The tester 23 includes a memory 23a for storing a measurement result.

The selector switch 14 has four selector contacts 14a to 14d. The first selector contact 14 is connected to a connection point between the first delay circuit 12a and the second delay circuit 12b, the second selector contact 14b is connected to a connection point between the second delay circuit 12b and the third delay circuit 12c, the third selector contact 14c is connected to a connection point between the third delay circuit 12c and the fourth delay circuit 12d, and the fourth selector contact 14 is connected to the output terminal of the fourth delay circuit 12d. The selector switch 14 is operated based on a selection signal input from the output switch 15.

The input to the first delay circuit 12a is connected to the mode switch 13. The mode switch 13 has two selector contacts. The first selector contact 13a receives a reference pulse signal c output from the tester 23, and the second selector contact 13b receives a signal output from an internal circuit. The output switch 15 has two selector contacts. The first selector contact 15a receives a selection signal a via a selection signal input terminal 27 from the tester 23, and the second selector contact 15b receives the output from the PROM 17.

The reference pulse signal c output from the tester 23 is input via the reference pulse input terminal 19 to the first selector contact 13a. An operation mode signal m is output from the tester 23, and is input via the operation mode input terminal 20 to the mode switch 13 and to the output switch 15. A PROM write signal r is input via the write terminal 22 to the PROM 17. The selection signal a is input via the selection signal input terminal 27 to the first selector contact 15a of the output switch 15. The selector switch 14 outputs a delay signal d via the output terminal 21 to the tester 23.

The prior delay generation circuit 33 can set a delay time in a test mode so that the delay time does not exceed a specified delay time T. When the test mode terminates and a normal mode starts, the internal circuit in the semiconductor device 32 outputs signals via the delay generation circuit 33 whose delay time is set to a desired value.

In the prior art, the delay generation circuit 33 performs the test when the operation mode signal m from the tester 23 is a second logic level (hereinafter referred to as "0"), and enters the normal mode when the operation mode signal m is a first logic level (hereinafter referred to as "1"). That is, when the operation mode signal m is 0, the mode switch 13 connects the movable contact 13c to the first selector contact 13a, and the output switch 15 connects the movable contact 15c to the first selector contact 15a. When the operation mode signal m is 1, the mode switch 13 connects the movable contact 13c to the second selector contact 13b, and the output switch 15 connects the movable contact 15c to the second selector contact 15b.

The first to fourth delay circuits 12a to 12d have delay times Ta to Td, respectively. The delay times Ta, Tb, Tc, and Td are added to the signal passing successively through the delay circuits 12a to 12d.

In the test mode, the reference pulse signal c output from the tester 23 is input via the mode switch 13 to the first delay circuit 12a as the reference signal q, and timings of the pulses output from the first to fourth delay circuits 12a to 12d are checked. In the normal operation, the PROM 17 outputs the written selection information to the selector switch 14, and one of the delay circuits 12a to 12d selected by the selector switch 14 outputs the signal via the output terminal 21 to the tester 23.

The reference signal q is input via the mode switch 13 to the first delay circuit 12a, which outputs a delay signal d1 that is delayed from the input reference signal q by the delay time Ta, to the second delay circuit 12b and to the first selector contact 14a. The second delay circuit 12b, which receives the delay signal d1, outputs a delay signal d2 with the delay time (Ta+Tb) that is delayed from the delay signal d1 by the delay time Tb, to the third delay circuit 12c and to the second selector contact 14b.

The third delay circuit 12c, which receives the delay signal d2, outputs a delay signal d3 with the delay time (Ta+Tb+Tc) that is delayed from the delay signal d2 by the delay time Tc, to the fourth delay circuit 12d and to the third selector contact 14c. The fourth delay circuit 12c, which receives the delay signal d3, outputs a delay signal d4 with the delay time (Ta+Tb+Tc+Td) that is delayed from the delay signal d3 by the delay time Td, to the fourth selector contact 14d.

The operation of the delay generation circuit 33 of the prior semiconductor device 32 will be explained.

First Prior Method

The prior semiconductor device 32 sets up the PROM 17 in the semiconductor device 32 based on a measurement result of the delay times in the stages of the delay circuits. To set the delay time, the tester 23 is connected to the semiconductor device 32, and a measurement is performed according to following steps:

1) The tester 23 outputs the operation mode signal m to the operation mode input terminal 20. In response to the input to the mode input terminal 20, the mode switch 13 and the output switch 15 are switched to the test mode contacts 13a and 15a.
2) The tester 23 outputs the selection signal a to the selection signal input terminal 27 which is specially prepared in advance. In response to the input of the selection signal a, the selector switch 14 connects the selector contact 14a to the output terminal 21.
3) The tester 23 outputs the reference pulse signal c to the reference pulse input terminal 19 which is specially prepared. In response to the input of the reference pulse signal c, the tester 23, connected to the output terminal 21, reads the delay signal which passes through the first stage of the delay circuit and which is output to the output terminal 21.
4) The tester 23 determines whether the read delay signal d has a delay time within a predetermined delay time specified in the standard. The determination result is stored in the memory 23a in the tester 23. The read operation for the delay signal d is repeated for all the stages of the delay circuits 12.
5) According to the predetermined determination standard, the delay output is selected. Based on this determination, the tester 23 outputs a selector setting signal to the write terminal 22, which is specially prepared in the semiconductor device 32, and the selector setting signal is written in the PROM 17 in the semiconductor device 32.

Second Prior Method

1) The tester 23 outputs the operation mode signal m to the operation mode input terminal 20 of the semiconductor device 32. In response to the input of the operation mode signal m, the mode switch 13 and the output switch 15 are switched to the test mode contacts 13a and 15a.
2) The tester 23 outputs the selection signal a to the selection signal input terminal 27 which is specially prepared. In response to the input selection signal a, the selector switch 14 connects the selector contact 14d to the output terminal 21. That is, the output d4 from the delay circuit 12d in the last stage is connected to the output terminal 21.
3) The tester 23 outputs the reference pulse signal c to the reference pulse input terminal 19 which is specially prepared. In response to the input reference pulse signal c, the tester 23, connected to the output terminal 21, reads the delay signal d4 which passes the last stage delay circuit 12d and is output to the output terminal 21.
4) The tester 23 obtains the total delay time of all delay circuits 12a to 12d based on the read delay signal d4, and calculates a delay time of one stage by dividing the total delay time by the number of the delay circuits.
5) Based on the calculation, the stage delay circuit is selected to allow the delay signal to have a desired delay time. Based on this determination, the tester 23 outputs the selection signal a to the write terminal 22, which is specially prepared, and writes the selection signal in the PROM 17 in the semiconductor device 32.

However, in the above described manner of measurement, a number of the connection terminals 19 to 22, and 27 for inputting and outputting signals to and from the tester 23 are required, making the body of the semiconductor device 32 large. Further, to allow the input and output terminal 19 to 22, and 27 to serve terminals to be used in the normal operation, the structure of the semiconductor device 32 becomes complicated.

In the first prior method, because the tester 23 produces the selection signal a to switch the selector switch 14 in the measurement program, steps of the measurement program may be lengthened, and not much time is required to set the output delay time.

Further, the pulse width and interval between pulses of the reference pulse signal c from the tester 23 must be longer than the total delay time (Ta+Tb+Tc+Td) of all the delay circuits 12. That is, the period of the reference pulse signal c must be more than twice the delay time (Ta+Tb+Tc+Td). The tester 23 reads the output signal when the predetermined delay time has passed from the output of the reference pulse signal c. When the pulse width is too short (FIG. 8a), the output signal d is immediately reversed, and the tester 23 may not be able to determine whether the signal is output before or after the end of the predetermined delay time T (FIGS. 8b and 8c).

Conversely, when the pulse width is too long (FIG. 8d), the output signal d is immediately reversed and becomes 1, and the tester 23 cannot determine whether the signal is output before or after the end of the predetermined delay time T (FIGS. 8e and 8f).

As a result, the pulse width of the reference pulse signal c must be long enough to perform the test, and it takes much time to complete the test.

In the second prior method, the delay times of all the stages must be precise. Although the tester 23 is designed to determine whether the performance is good or bad, the tester 23 must monitor the delay signal d from the output terminal 21 in much shorter periods to measure the delay time accurately. Therefore, the tester 23 cannot perform other tests during the monitor operation. Further, to perform the test precisely, an expensive tester which operates at a high speed is required.

BRIEF SUMMARY OF THE INVENTION

It is therefore an object of the present invention to provide a semiconductor device and a method for setting a delay time which reduces the number of the connection terminals to be connected to a tester, making the construction simple, and which shortens steps in a measurement program for the tester, shortening the time required to set an output delay time.

In order to accomplish the above object, a semiconductor device for setting a delay time, according to the present invention, comprises: a plurality of serially connected delay circuits to which a reference signal is input; a selector switch for selecting one of delay signals output from connection points between the delay circuits; and an internal selection signal generator for producing a selection signal for switching the selector switch to select one of the connection points.

According to the present invention, one of the connection points between the delay circuits is selected based on the internal selection signal, and the reference signal is output from the selected connection point as the delay signal, eliminating input terminals for inputting the selection signal from external devices, reducing the number of the terminals, and making the structure of the device simple. Further, the present invention shortens steps in a measurement program in a tester, and not much time is required to set the output delay time, thereby shortening the process of manufacturing the semiconductor device and the test therefor, and reducing the manufacturing and test costs.

The selection signal generator is a counter for counting a reference pulse signal from which the reference signal is produced. The selector switch comprises: a plurality of selector contacts connected to respective connection points, respectively; and a movable contact connectable to one of the selector contacts depending on the selection signal. The semiconductor device further comprises an internal reference signal generator for generating the reference signal. The counter may output the reference signal.

The semiconductor device according to present invention, further comprises: an operation mode input terminal for inputting a test mode signal; an output terminal for outputting the delay signal from the delay circuits; and a reference pulse input terminal for inputting and outputting a reference pulse signal from which the reference signal is produced. The semiconductor device further comprises a write terminal for inputting a write signal specifying at least one of the delay circuits which produces the delay signal selected by the selector switch. The semiconductor device further comprises an equaldivider for producing the reference signal from a reference pulse signal.

The method for setting a delay time of a semiconductor device, according to the present invention, comprises the steps of: inputting a reference signal obtained by equally dividing a reference pulse signal to a plurality of serially connected delay circuits; selecting one of delay signals output from the delay circuits; measuring the delay time of the selected delay signal when a predetermined reference delay time has passed; determining which delay signal satisfies the reference delay time based on the measurement; and writing information specifying a connection point between the delay circuits in a storage device based on the determination.

The method further comprises the step of repeating step of inputting a reference signal to the step of determining which delay signal satisfies the reference delay time. Further, The method further comprises the step of terminating the repetition of steps when the measurements for two subsequent reference pulse signals yield the same result.

The method further comprises the step of writing the number of the reference pulse signals, produced until the measurements for two subsequent reference pulse signals yield the same result, in the storage device so that the set delay time exceeds the predetermined reference delay time. Alternatively, the method further comprises the steps of: subtracting 1 from the number of the reference pulse signals, produced until the measurements for two subsequent reference pulse signals yield the same result; and writing the value obtained from the subtraction in the storage device so that the set delay time is within the predetermined reference delay time. The method may comprise the step of writing a counting number in the storage device, the counting number being obtained by a counter for counting the number of the reference pulse signal.

BRIEF DESCRIPTION OF THE DRAWINGS

FIGS. 8a to 8f are timing charts for explaining the problem in the method for measuring a delay time of the background art.

DETAILED DESCRIPTION OF THE INVENTION

First Embodiment

Referring to Figures, the best mode of the semiconductor device, according to a first embodiment of the present invention, will be explained.

Figure 1:
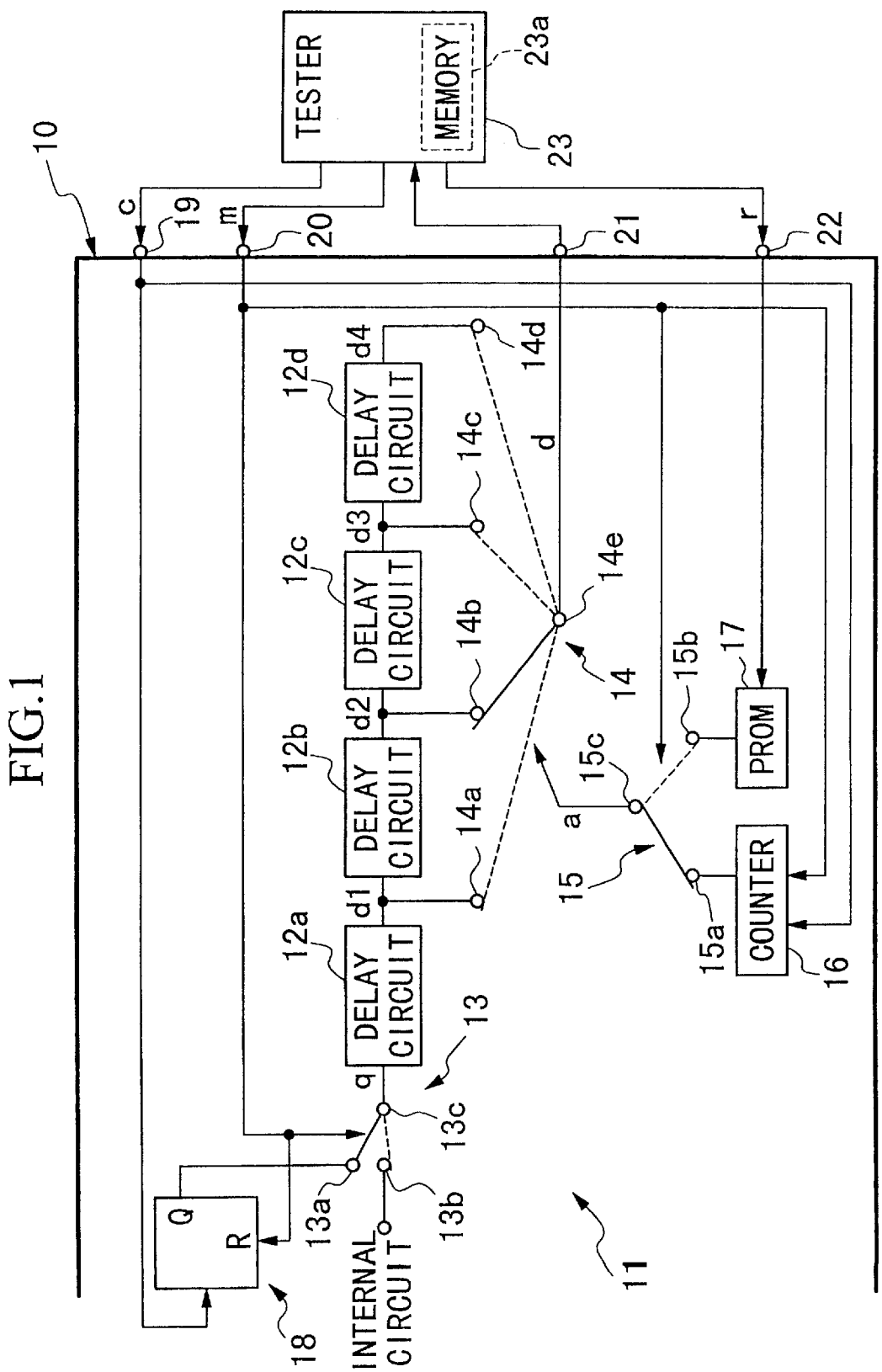
FIG. 1 is a block diagram showing the first embodiment of the delay generation circuit in the semiconductor device according to the present invention.

FIG. 1 is a block diagram showing the delay generation circuit in the semiconductor device of the first embodiment.

The delay generation circuit 10 in the semiconductor device 10 includes four delay circuits 12a to 12d, which are serially connected, a mode switch 13, a select switch 14, an output switch 15, a counter 16, a PROM 17, and an equal-divider 18.

The semiconductor device 10 includes four terminals which are a reference pulse input terminal 19, an operation mode input terminal 20, an output terminal 21, and a write terminal 22, through which the semiconductor device is connected to a semiconductor tester 23. The tester 23 has a memory 23a for storing the measurement result by the tester 23.

The delay circuits 12a to 12d comprise delay elements causing time delays Ta, Tb, Tc, and Td, which delay a reference signal q input from the mode switch 13 and signals within the circuit by the predetermined delay time.

The mode switch 13 has two selector contacts. The first selector contact 13a is connected to the output terminal Q of the equal-divider 18, and the second selector contact 13b is connected to the output of the internal circuit of the semiconductor device 10. A movable contact 13c of the mode switch 13b is connected to the input of the first delay circuit 12a. The mode switch 13 is operated depending on an operation mode signal m from the tester 23. When the operation mode signal m is 0 (test mode), the movable contact 13c is connected to the first selector contact 13a. When the operation mode signal m is 1 (normal operation mode), the movable contact 13c is connected to the second selector contact 13b.

The selector switch 14 includes four selector contacts 14a to 14d. The first selector contact 14a is connected to a connection point between the first delay circuit 12a and the second delay circuit 12b, the second selector contact 14b is connected to a connection point between the second delay circuit 12b and the third delay circuit 12c, the third selector contact 14c is connected to a connection point between the third delay circuit 12c and the fourth delay circuit 12d, and the fourth selector contact 14d is connected to the output from the fourth delay circuit 14d. The selector switch 14 is selectively switched depending on a selection signal a output from the movable contact 15c of the output switch 15.

For example, when the counting number in the counter 16 or the setting value in the PROM 17 is 1, the movable contact 14e is connected to the first selector contact 14a, so that the selector switch 14 allows the delay signal d1 to output from the first delay circuit 12a to the output terminal 21. The movable contact 14e is connected to the second selector contact 14b when the counting number is 2, the movable contact 14e is connected to the third selector contact 14c when the counting number is 3, and the movable contact 14e is connected to the fourth selector contact 14d when the counting number is 4.

The output switch 15 has two selector contacts. The first selector contact 15a is connected to the output from the counter 16, and the second selector contact 15b is connected to the output from the PROM 17. The movable contact 15c of the output switch outputs the selection signal a to the selector switch 14. The output switch 15 is switched depending on the operation mode signal m from the tester 23. The movable contact 15c is connected to the first selector contact 15a when the operation mode signal m is 0 (test mode), and is connected to the second selector contact 15b when the operation mode signal m is 1 (normal operation mode).

The counter 16 counts the number corresponding to the number of stages of the delay circuits 12a to 12d, and determines which selector contact the movable contact 14e of the selector switch 14 is connected to depending on the counting number in the test mode. The signal input of the counter 16 is connected to the reference pulse input terminal 19 to which a reference pulse signal c is input. The signal output of the counter 16 is connected to the first selector contact 15a of the output switch 15 to output the counting number. The reset input of the counter 16 is connected to the operation mode input terminal 20 to which the operation mode signal m is input.

The counter 16 is reset by lowering the operation mode signal m, thereby setting the counting number to 0. After the reset, the counter 16 increments by one in response to raising the reference pulse signal c, and the counting number is output as the selection signal a via the output switch 15 to the selector switch 14.

The PROM 17 determines which selector contact movable contact 14e of the selector switch 14 is connected to depending on the setting value in the normal operation mode. The setting value may correspond to the number of the stages of the delay circuits 12a to 12d. The input of the PROM 17 is connected to the write terminal 22 to which a PROM write signal r is input. The output of the PROM 17 is connected the second selector contact 15b of the output switch 15, and outputs the setting value.

The equal-divider 18 generates the reference signal q by equally dividing the reference signal c. The CLK input of the divider is connected to the reference pulse input terminal 19, the reset input of the divider is connected to the operation mode input terminal 20, and the output terminal Q of the divider is connected the first selector contact 13a of the mode switch 13. The equal-divider 18 is reset by lowering the operation mode signal m, and sets the output terminal Q to 0.

The reference pulse signal c output from the tester 23 is supplied via the reference pulse input terminal 19 to the clock terminal CLK of the equal-divider 18 and to the counter 16. The pulse width and the pulse interval of the reference pulse signal c may be longer than the total delay time (Ta+Tb+Tc+Td) of the delay circuit 12. That is, the period of the reference pulse signal c may be equal to or more than the total delay time (Ta+Tb+Tc+Td).

The operation mode signal m output from the tester 23 is supplied via the operation mode input terminal 20 to the mode switch 13 and to the output switch 15 in order to switch the semiconductor device to the normal operation mode or to the test mode.

The delay generation circuit 11 performs the test operation when the operation mode signal m from the tester 23 is 0, and performs the normal operation when the signal m is 1. That is, when the operation mode signal m is 0, the mode switch 13 connects the movable contact 13c to the first selector contact 13a, and the output switch 15 connects the movable contact 15c to the first selector contact 15a. When the operation mode signal m is 1, the mode switch 13 connects the movable contact 13c to the second selector contact 13b, and the output switch 15 connects the movable contact 15c to the second selector contact 15b.

The counter 16 is reset by the rising edge of the operation mode signal m so that the counting number is set to 0.

When the normal mode is started after completion of the test operation, the signal output from the internal circuit in the semiconductor device 10 is output through the delay generation circuit 11, whose delay time is set to a predetermined delay time.

The delay signal d output from the selector switch 14 is input via the output terminal 21 to the tester 23.

The PROM write signal r is supplied via the write terminal 22 to the PROM 17. The tester 23 writes information for setting the selector switch 14 into the PROM 17.

In the embodiment, an example in which the delay generation circuit 11 sets the delay time which does not exceed the reference delay time (specified delay time) in the test mode will be explained.

The first to fourth delay circuits 12a to 12d have the delay times Ta, Tb, Tc, and Td, respectively. The delay times Ta, Tb, Tc, and Td are added to the signal passing successively through the delay circuits 12a to 12d.

In the test mode, the reference pulse signal c output from the tester 23 is transmitted via the equal-divider 18 and the mode switch 13, and is input to the first delay circuit 12a as the reference signal q. The timings of the pulses output from the first to fourth delay circuits 12a to 12d are checked. In the normal operation, the selector information stored in the PROM 17 is output via the output switch 15 to the selector switch 14, so that one of the output signals from the first to fourth delay circuits 12a to 12d, which is selected by the selector switch 14, is output via the output terminal 21 to the tester 23.

In the test mode, the equal-divider 18 outputs the reference signal q from the output terminal Q asynchronously with the rising edge of the reference pulse signal c. The reference signal q has a period of twice the period of the reference pulse signal c.

The reference signal q is input via the mode switch 13 to the first delay circuit 12a, which then outputs a delay signal d1 that is delayed from the input reference signal q by the delay time Ta, to the second circuit 12b and to the first selector point 14a. The second delay circuit 12b, which receives the delay signal d1, outputs a delay signal d2 with a delay time (Ta+Tb) that is delayed from the delay signal d1 by the delay time Tb, to the third delay circuit 12c and to the second selector point 14b.

The third delay circuit 12c, which receives the delay signal d2, outputs a delay signal d3 with a delay time (Ta+Tb+Tc) that is delayed from the delay signal d2 by the delay time Tc, to the fourth delay circuit 12d and to the third selector point 14c. The fourth delay circuit 12d, which receives the delay signal d3, outputs a delay signal d4 with a delay time (Ta+Tb+Tc+Td) that is delayed from the delay signal d3 by the delay time Td, to the fourth selector point 14d.

Figure 2:
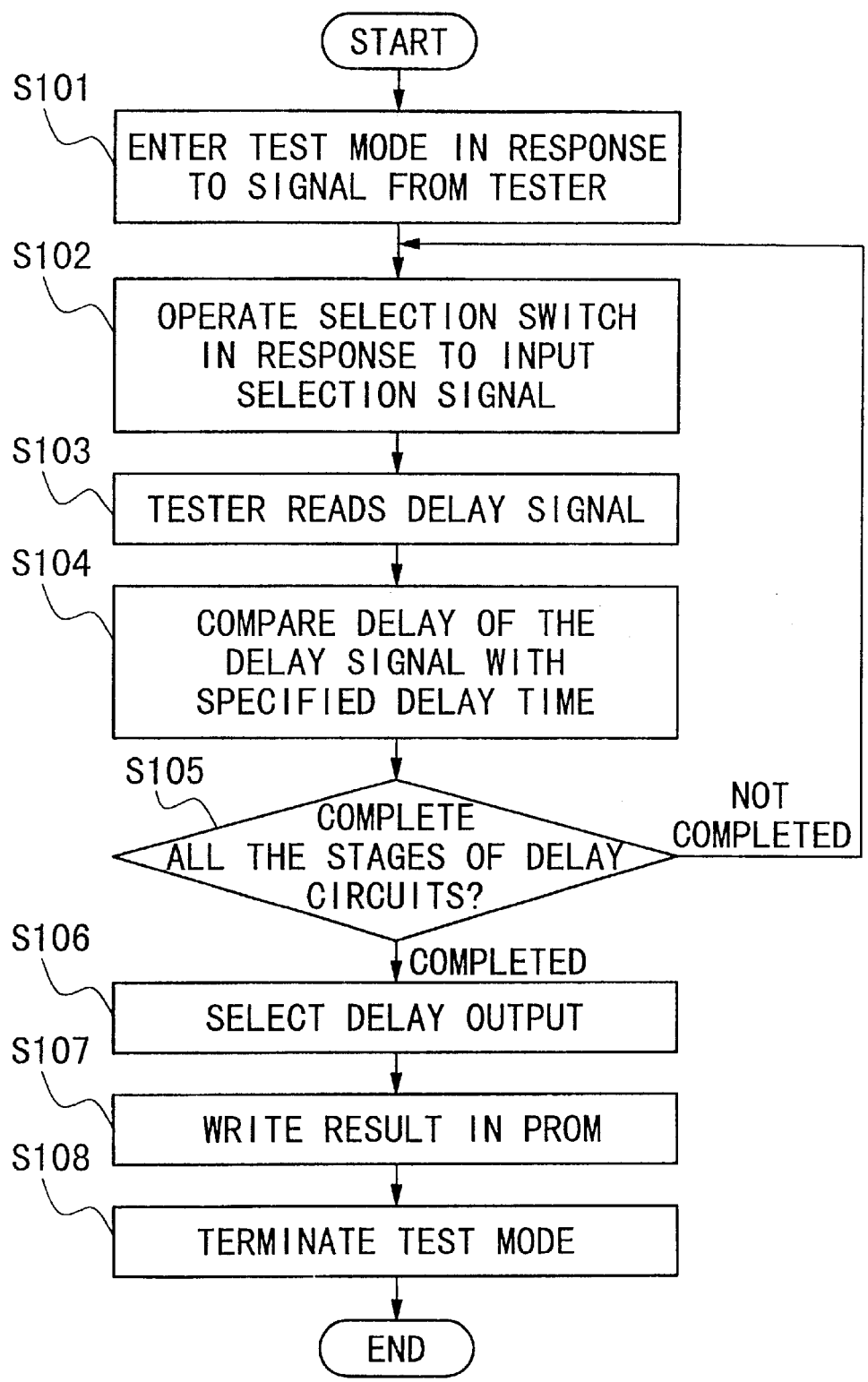
FIG. 2 is a flow chart showing the delay time setting operation in the delay generation circuit of FIG. 1 of the present invention.

Referring to FIG. 2, the operation of the delay generation circuit 11 will be explained.

FIG. 2 is a flow chart showing the delay time setting operation performed by the delay generation circuit 11. When the delay generation circuit 11 sets a desired delay time, the tester 23 performs a test for the delay circuit according to the process shown in FIG. 2.

In step S101, the operation mode signal m output from the tester 23 is set to 0, so that the delay generation circuit 11 enters the test mode. In the test mode, the mode switch 13 is connected to the first selector contact 13a, and the output switch 15 is connected to the first selector contact 15a. The counter 16 and the equal-divider 18 are reset so that the counting number is set to 0 and the output terminal Q is set to 0.

In step S102, the tester 23 outputs the reference pulse signal c. When the reference pulse signal c rises, the counter 16 adds 1 so that the output selection signal a becomes 1, and the selector switch 14 connects the movable contact 14e to the first contact 14a. Thus, the delay signal d1 is output from the first delay circuit 12a to the output terminal 21. When the reference pulse signal c rises, the equal-divider 18 is reversed so as to output 1 from the output terminal Q. The signal is input via the mode switch 13 to the first delay circuit 12a, which outputs the delay signal d1 after the delay time Ta has passed. The delay signal d1 is input via the selector switch 14 and the output terminal 21 to the tester 23.

In step S103, the tester 23 reads the input delay signal d1. This delay signal d1 from the output terminal 21 is produced by inputting the reference pulse signal c from the equal-divider 18 via mode switch 13 to the first delay circuit 12a and adding the delay time Ta using the first delay circuit 12a.

In step S104, when the specified delay time T has passed from the output of the reference pulse signal c, the tester 23 measures whether the delay signal d1 is set to 0 or 1. When the number of the reference pulse signal c output from the tester 23 is an odd number, the tester 23 determines, based on the measurement result of 1, that the delay is within the specified delay time T, and determines, based on the measurement result of 0, that the delay exceeds the time T. Conversely, when the number is even, the tester 23 determines, based on the measurement result of 0, that the delay is within the specified delay time T, and determines, based on the measurement result of 1, that the delay exceeds the time T. The tester 23 stores the measurement result into the memory 23a.

In step S105, while the determination for all four stages of the delay circuit is not yet completed, the steps S102 to S104 are repeated. When the repetition is completed, the flow proceeds to step S106.

When the determination is not completed, the equal-divider 18 reverses the output at the output terminal Q asynchronously with the rising edge of the reference pulse signal c. The selector switch 14 successively connects the second selector contact 14b to the fourth selector contact 14d. The tester 23 measures the delay outputs d2 to d4, when the specified delay time T has passed from the edge of the reference signal q, makes determination for all the stages of the delay circuits whether the output delay signals d are within or exceed the specified delay time T, and stores the determination results into the memory 23a.

In step S106, the tester 23 selects the delay signal d based on the determination results stored in the memory 23a. When the delay signals d are within the specified delay time T, the determination results are 1, 0, 1, and 0. . . , that is, 1 and 0 are alternatively repeated. When the delay times exceed the specified delay time T, the determination results includes portions of "1, 1" or "0, 0" in which the same values are repeated. When detecting the repetition of the same values, the tester 23 calculates the position of the data. For example, when the determination result is "1001", it is determined that the delay signal d2 from the second stage is within the specified delay time T, and that the delay signal d3 from the third stage exceeds the specified delay time T. When the determination results shows "1011", it is determined that the output from the third stage is within the specified delay time, and that the output from the fourth stage exceeds the specified delay time T. For example, assume that the delay signal d3 from the third stage delay circuit 12c is within the specified delay time T and is the closest value to the time T.

In step S107, the tester 23 outputs 3, which is the stage number of the delay circuit outputting the delay signal d3, as the PROM write signal r, which is written via the write terminal 22 in the PROM 17 in the semiconductor device 10.

In step S108, the tester 23 terminates the test mode, and enters the normal operation mode. That is, the tester 23 set the operation mode signal m to 1, so that the mode switch 13 connects the movable contact 13c to the second selector contact 13b and the output switch 15 connects the movable contact 15c to the second selector contact 15b. Then, the tester 23 performs other normal tests now shown.

When the delay time is measured using the semiconductor device 10 of the first embodiment of the present invention and the tester 23, a selection signal input terminal 27 for inputting a selection signal in the method for measuring the delay time of the background art can be eliminated because the counter 16 in the semiconductor device 10 provides the selection signal. This reduces the number of the connection terminals to be connected to the tester 23, and simplifies the construction. Because the selection signal is not output, the steps in the tester measurement program are not slow, and not much time is required to set the output delay time.

In the present invention, the reference signal q is produced by equally dividing the reference pulse signal c with the equal-divider 18, and is input to the delay circuits 12a to 12d. The output therefrom is measured, reducing the period of the reference pulse signal c to a half of that of the background art, and reducing the time required for the test of the delay time.

Second Embodiment

The second embodiment of the present invention will be explained with reference to figures. Except regarding the manner in which the semiconductor device 10 determines the selected delay output and outputs a setting signal specifying the number of the stages in the delay circuits when it is detected that the delay time of the delay time exceeds the specified delay time T, the second embodiment is generally similar to the first embodiment.

Figure 3:
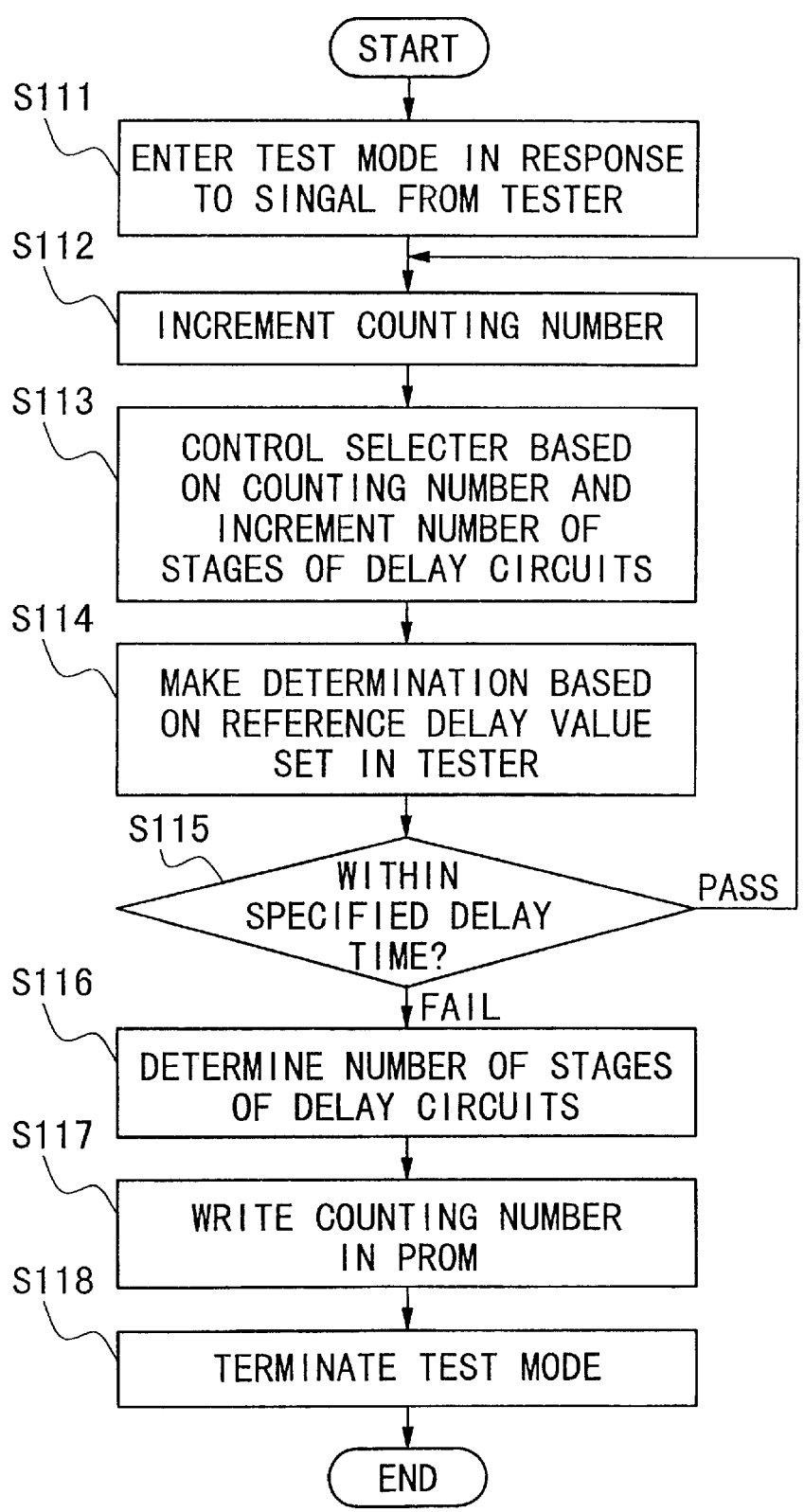
FIG. 3 is a flow chart showing the delay time setting operation of the second embodiment of the present invention.
Figure 4:
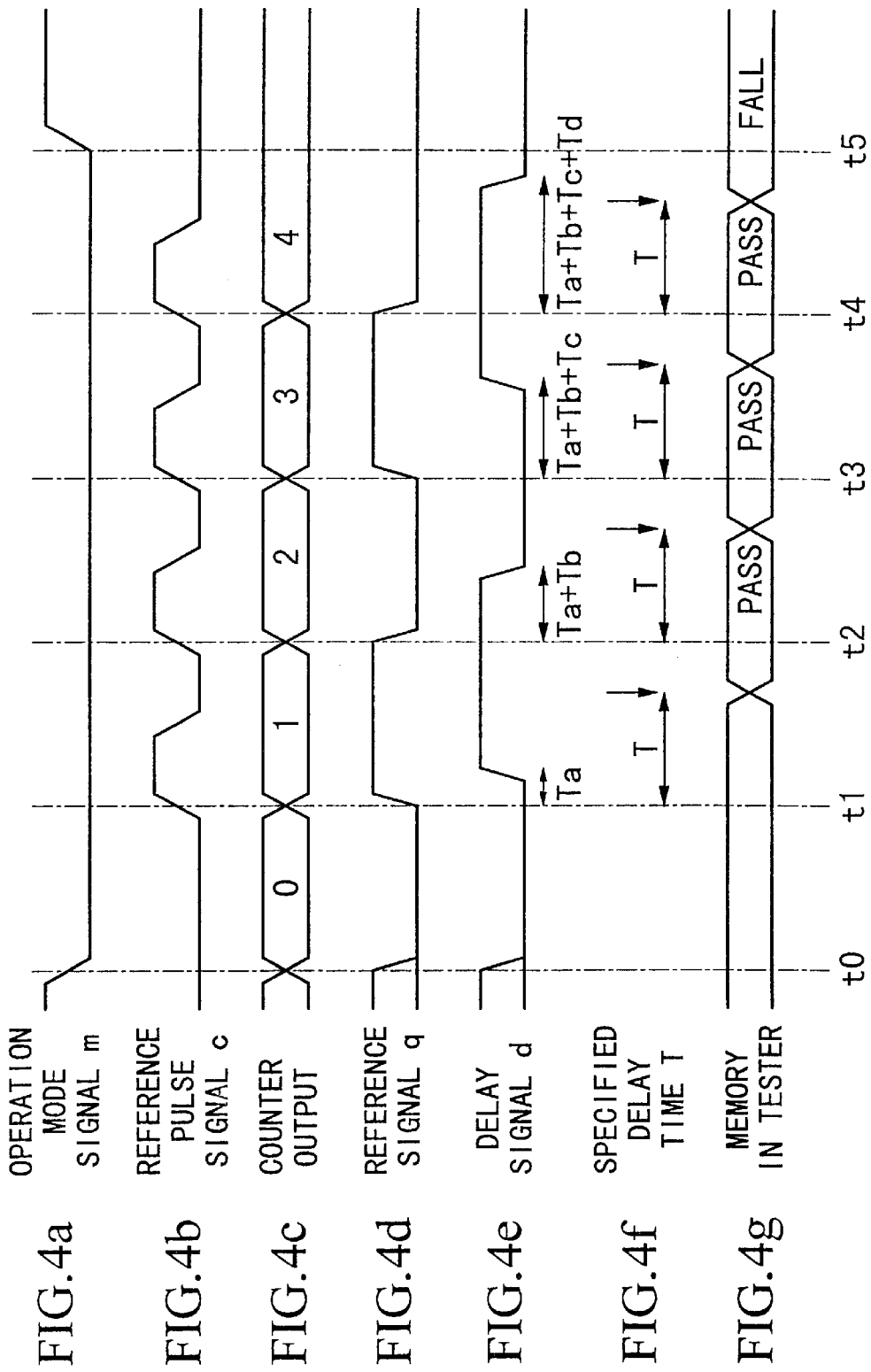
FIGS. 4a to 4g are timing charts of the delay time setting operation of the second embodiment.

FIG. 3 is a flow chart showing the delay time setting operation performed by the second embodiment. FIG. 4 is a timing chart showing the delay time setting operation in the second embodiment. The operation of the second embodiment will be explained with reference to FIGS. 1, 3, and 4.

In step S111 at a time to, when the operation mode signal m output from the tester 23 becomes 0 (see FIG. 4a), the semiconductor device 10 enters the test mode. In the test mode, the mode switch 13 is connected to the first selector contact 13a, and the output switch 15 is connected to the first selector contact 15a. When the operation mode signal m is lowered, the counter 16 and the equal-divider 18 are reset so that the reference output q from the equal-divider 18 is set to 0 (FIG. 4b), and the output from the counter is set to 0 (FIG. 4c).

In step S112 at a time t1, the tester 23 outputs 1 as the first reference pulse signal c (FIG. 4b). When the reference pulse signal c rises, the counter 16 increments the counting number, and outputs 1 as the counter output (FIG. 4c). Asynchronously with the rising reference pulse signal c, the equal-divider 18 outputs 1 as the reference signal q (FIG. 4d). This output is transmitted through the first to fourth delay circuits 12a to 12d. The output terminal 21 outputs the delay signal d1 whose rising edge is delayed from the rising edge of the reference signal q by the delay time Ta because of the first delay circuit 12a (FIG. 4e). The pulse width of the reference pulse signal c may be appropriately set to 0 before a time t2.

Based on the counting number of 1 added by the counter 16 in step S113 at the time t1, the selector switch 14 connects the movable contact 14e to the first selector contact 14a, so that the output d1 from the delay circuit 12a is connected to the output terminal 21.

In step S114 at the time t1, the delay signal d1 is input to the tester 23 (FIG. 4e). The tester 23 stores the specified delay time to be set in the semiconductor device 10. The tester 23 reads the delay signal d1 when the specified delay time T has passed from the output of the first reference pulse signal c (FIG. 4f).

In step S115 at the time t1, the tester 23 determines, based on the read result, whether the delay time d1 is within the specified delay time. The determination is made in a fashion similar to that in the first embodiment. Then, "PASS" is written in the memory 23a in the tester 23 because the delay time Ta of the delay signal d1 is shorter than the specified delay time T which is a comparative value used in the determination by the tester 23 (FIG. 4g).

Because of the determination result "PASS", the tester 23 returns to step S112.

In step S112 at the time t2, the tester 23 again outputs 1 as the second reference pulse signal c. At the rising edge of the signal c, the counter 16 outputs 2 as the counter output (FIG. 4c), the equal-divider 18 reverses the output and outputs 0 as the reference signal q (FIG. 4d). The reference signal q is input to the delay circuit 12a and is transmitted therethrough.

In step S113 at the time t2, the selector switch 14 connects the movable contact 14e to the second selector contact 14b. The output terminal 21 outputs the delay signal d2 whose falling edge is delayed from the falling edge of the reference signal q by the delay time (Ta+Tb) (FIG. 4e) because of the second delay circuit 12b.

In step S114 at the time t2, the delay signal d2 is input to the tester 23, which reads the delay signal d2 when the specified delay time T has passed from the output of the second reference pulse signal c (FIG. 4f).

In step S115 at the time t2, the tester 23 determines, based on the read result of 0, that the delay time (Ta+Tb) is shorter than the specified delay time t, and writes "PASS" into the memory 23a (FIG. 4g). The tester 23 returns to step S112 because the determination result is "PASS".

In the following, at a time t3 when the third reference pulse signal c of 1 is output, the counter 16 outputs 3 (FIG. 4c), and the reference signal q is set to 1 (FIG. 4d). Then, the selector switch 14 connects the movable contact 14e to the third selector contact 14c, so that the output terminal 21 outputs the delay signal d3 whose rising edge is delayed from the rising edge of the third reference pulse signal c by the delay time (Ta+Tb+T) (FIG. 4e). Because the delay time (Ta+Tb+Tc) of the delay signal d3 is shorter than the specified delay time T (FIG. 4f), the tester 23 reads the determination value of 1, and writes "PASS" into the memory 23a.

In step S112 at a time t4, when the fourth reference pulse signal c is 1, the counter 16 outputs 4 asynchronously with the rising edge of the reference pulse signal c (FIG. 4c), so that the reference signal q becomes 0 (FIG. 4d).

In step S113 at the time t4, the selector switch 14 is connected to the fourth contact 14d, and the output terminal 21 outputs the delay signal d4 whose falling edge is delayed from the rising edge of the reference pulse signal c by the delay time (Ta+Tb+Tc+Td) (FIG. 4e).

In step S114 at the time t4, the tester 23 reads the delay signal d4 when the specified delay time T has passed from the output of the fourth reference pulse signal c (FIG. 4f). Because the delay time (Ta+Tb+Tc+Td) is longer than the specified delay time T (FIG. 4f), the tester 23 reads 1.

In step S115 at the time t4, when the tester 23 reads the same value as the value of 1 read at the time t3, the tester 23 determines that the delay exceeds the specified delay time (FAIL), and writes "FAIL" into the memory 23a (FIG. 4g). Based on the result of "FAIL", the tester 23 proceeds step S116.

In step S116, according to the number of the results of "PASS" in the memory 23a, the tester 23 determines the number of the delay circuits whose delay does not exceed the specified delay time T.

In step S117, the tester 23 writes the counting number of 3 via the write terminal 22 into the PROM 17 in the semiconductor device 10.

In another embodiment, when the tester 23 determines that the result is "FAIL", the PROM write signal r may be output, and the counting number, which is calculated by subtracting 1 from the counting number of 4 of the counter 16, may be written into the PROM 17 in the semiconductor device 10.

In step S118, the test mode terminates, and the device enters the normal operation mode. That is, the tester 23 sets the operation mode signal m to 1, so that the mode switch 13 connects the movable contact 13c to the second selector contact 13b, and the output switch 15 connects the movable contact 15c to the second selector contact 15b. Then, the tester 23 performs other normal tests not shown.

In the second embodiment, because the output delay signal d is selected when the determination is made whether the delay time of the delay signal d is within the specified delay time T, it is unnecessary to measure all the stages of the delay circuits, and this shortens the time required for setting the delay time, compared with a device which measures all the stages. The other structure, function, and effect are similar to those of the first embodiment.

Third Embodiment

The third embodiment of the present invention will be explained with reference to figures. In the third embodiment, the delay times of the delay signals are not below the specified delay time T (reference delay time). Except for a manner in which the delay generation circuit includes six delay circuits (not shown), the third embodiment is generally similar to the embodiment of FIG. 1

Figure 5:
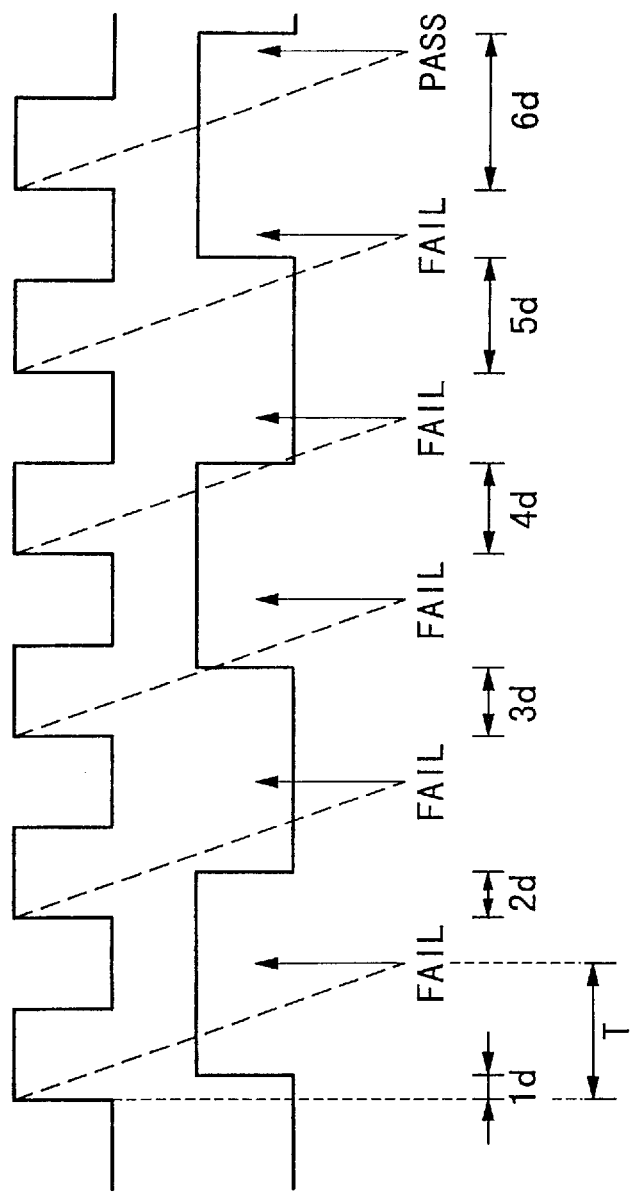
FIGS. 5a to 5d are timing charts of the delay time setting operation of the third embodiment.

FIG. 5 is a timing chart showing the delay time setting operation in the third embodiment. As shown in FIG. 5, when the tester 23 inputs the reference pulse signal c (FIG. 5a), the first to the sixth delay circuits output delay outputs d (FIG. 5b) having delay times 1d to 6d. The value 1d represents the delay time caused by each stage of the delay circuits, and the time width T (FIG. 5e) represents the specified delay time set in the tester 23.

The tester 23 reads the delay signals d when the specified delay time T has passed from the input of the reference pulse signal c. When the delay signals d are within the specified delay time T, the measurement results are 1, 0, 1, and 0..., in which 1 and 0 are alternatively repeated, and the tester 23 determines that the result is "FAIL". When the delay time exceeds the specified delay time T, the measurement results includes a portion, such as "1, 1" and "0, 0", in which the same value is repeated, and the tester 23 determines that the result is "PASS".

When in the first determination step the delay time 1d is below the specified delay time T, the tester 23 determines that the result is "FAIL". The second to fourth determination steps are successively performed, and the tester 23 repeats determinations of the result of "FAIL".

In the fifth determination step, the tester 23 reads 1 for the delay signal d, and determines that the result is "FAIL".

In the sixth determination step, the tester 23 reads 1 for the delay signal d, which is the same value as the value in the fifth determination step, the tester 23 determines that the result is "PASS", and stores "FAIL" in the memory 23a.

The tester 23 counts the number of the reference pulse signals c which are output until the result of "PASS", and writes the counting number of 6 into the PROM 17 in the semiconductor device.

The present invention can be applied to the example which sets the delay time of the delay signal to above the specified delay time T, as well as to the example which sets the delay time of the delay signal to below the specified delay time T. The other structure, function, and effect are similar to the second embodiment.

Fourth Embodiment

Figure 6:
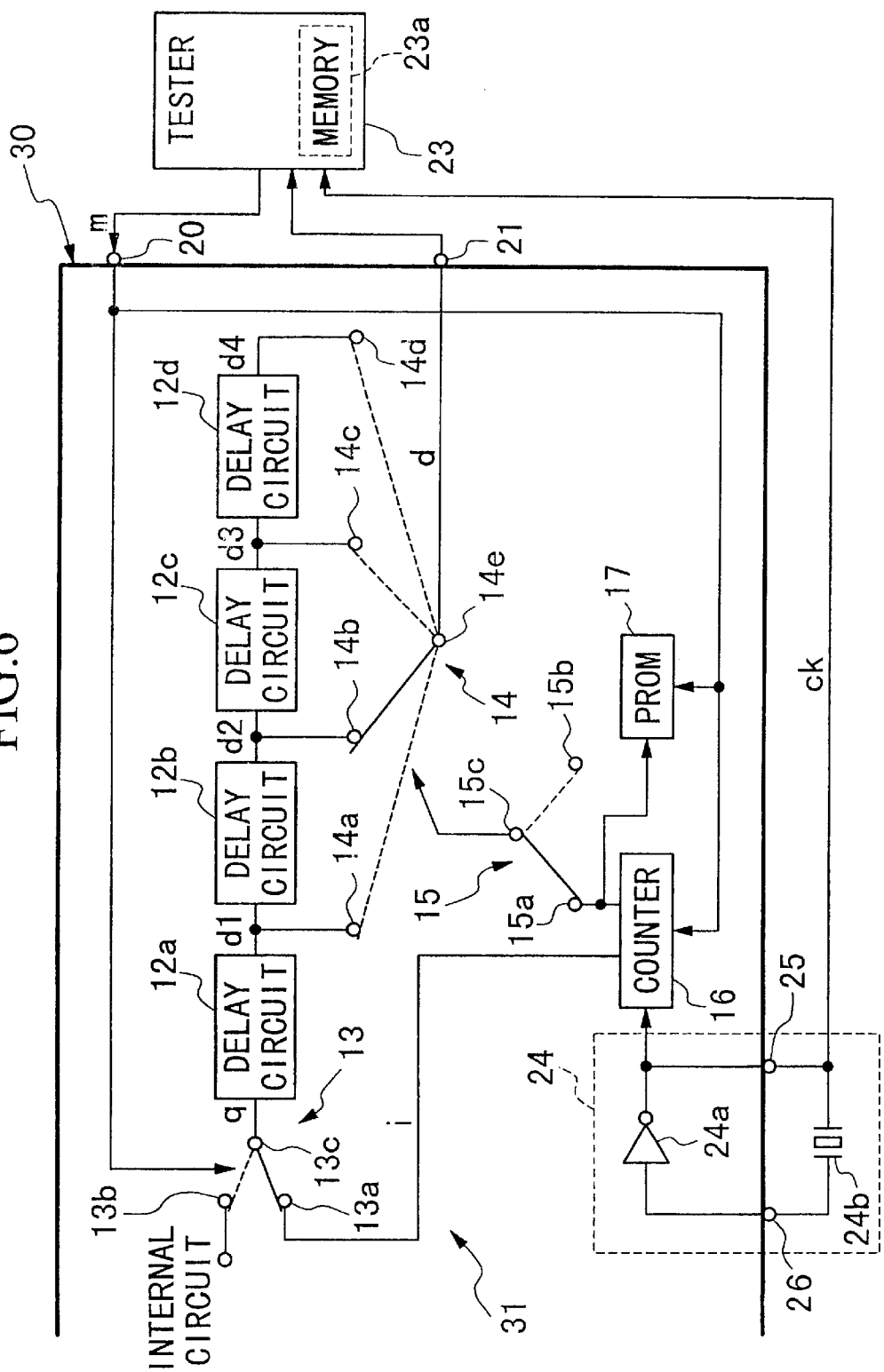
FIG. 6 is a block diagram showing the fourth embodiment of the delay generation circuit in the semiconductor device according to the present invention.
Figure 7:
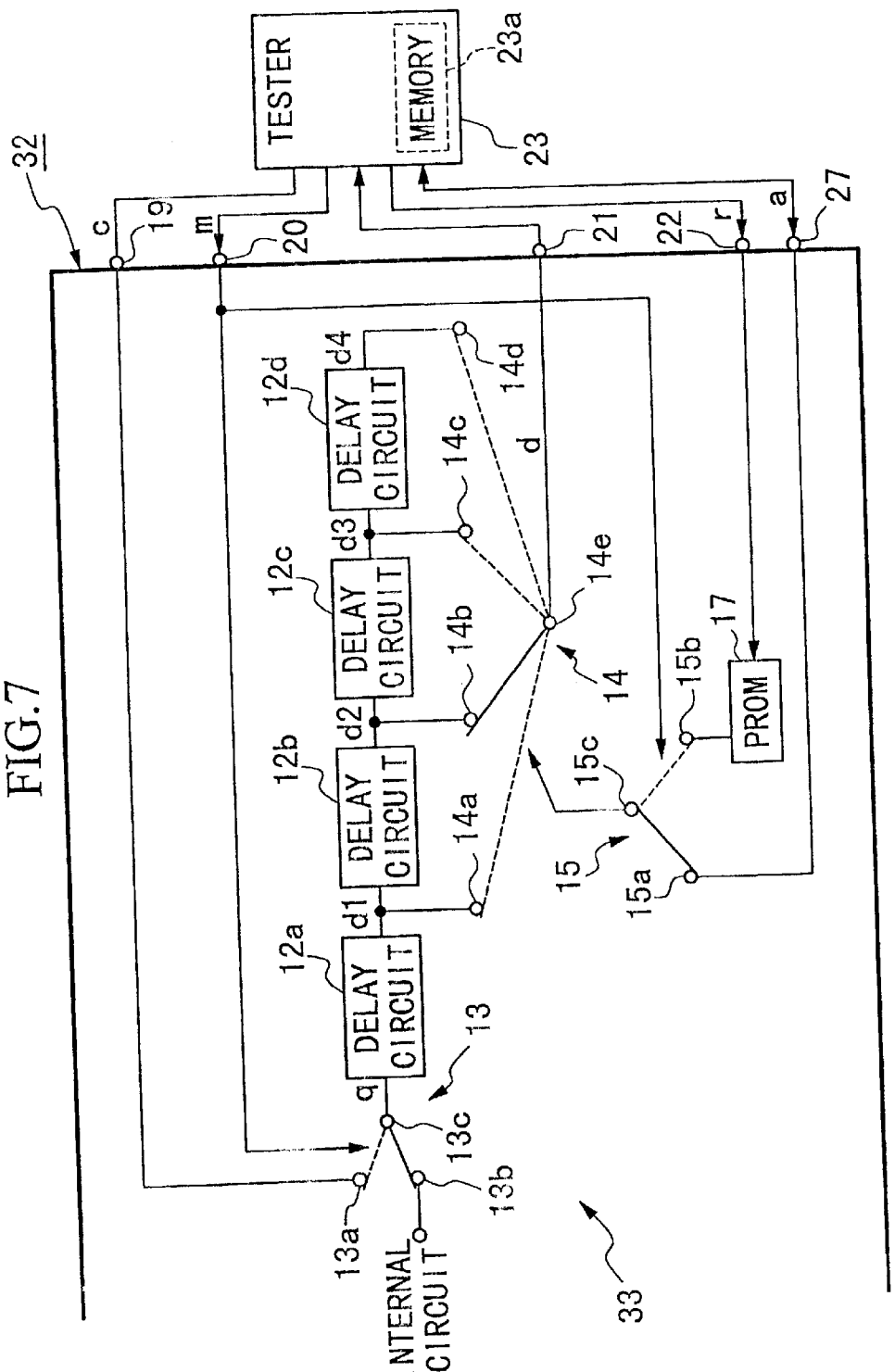
FIG. 7 is a block diagram showing the delay generation circuit in the semiconductor device in the background art.

The fourth embodiment of the present invention will be explained with reference to figures. FIG. 6 is a block diagram showing the fourth embodiment.

An internal oscillator circuit 24 in a semiconductor device 30 generates the reference pulse signal c. The internal oscillator circuit 24 comprises an inverter 24a and the oscillator 24b. An internal clock signal ck is output from the clock output terminal 25 of the inverter 24a, and is fed back via the oscillator 24b to a clock input terminal 26, so that the internal oscillator circuit 24 oscillates at the resonance frequency of the oscillator.

The clock output terminal 25 is connected to the tester 23, which uses a time of period from the rising point of the internal clock ck to the end of the specified delay time T as a reference period when the tester 23 reads the delay signal d.

The clock output terminal 25 is connected to the input of the counter 16. The counter 16 counts the pulses of the internal clock signal ck, and the counter output is supplied via the output switch 15 to the selector switch 14. The counter 16 equally divides the internal clock signal ck to produce an internal reference signal i, and inputs the signal i via the mode switch 13 to the delay circuit 12a. The counter 16 is reset by the falling edge of the operation mode signal m, counts the internal clock ck during the operation mode signal m is 0, and terminates counting when the operation mode signal m becomes 1.

The data input to the PROM 17 is connected to the output from the counter 16, so that the operation mode signal m is input to a write control input. The counter 16 writes the counting number into the PROM 17 at the rising edge of the operation mode signal m. To set the delay time to below the specified delay time, the counter 16 writes the number obtained by subtracting 1 from the counting number. To set the delay time to above the specified delay time, the counting number is written as is.

The internal clock signal ck corresponds to the reference pulse signal c in the first to third embodiments, and the internal reference signal i corresponds to the reference signal q in the first to third embodiments.

Except for the above described operation and function, the fourth embodiment is generally similar to those of the first to third embodiments.

In the embodiment, the internal reference clock i is output from the counter 16 in the semiconductor device 30, eliminating an exclusive terminal such as the reference pulse input terminal 19 for inputting the reference pulse signal c. The semiconductor device 30 supplies the internal clock signal ck via the prepared clock output terminal 25 to the tester 23, eliminating a terminal for accomplishing synchronization with the tester 23. The writing operation to the PROM 17 is controlled by the operation mode signal m input through the operation mode input terminal 20, eliminating the write terminal 22.

As compared with the prior semiconductor device 32 which receives the reference pulse signal c and the write signal r from the external tester 23, the present invention reduces the number of input and output terminals to be connected to the tester 23, simplifying the terminal structure.

The present invention eliminates outputting of the reference pulse signal c and the write signal r, and this decreases the number of the steps of the measurement program for the tester, making development of measurement programs easy. The output delay time can be set quickly without a high-speed expensive tester.

The other structure, function, and effect of the fourth embodiment are generally similar to those of the other embodiments.

The semiconductor device of the present invention reduces the number of the terminals to be connected to the tester, avoiding complication of the structure, and decreases the number of the steps of the measurement program so that the output delay time is quickly set, shortening the process of manufacturing semiconductor devices and of tests therefor, and lowering the manufacturing and testing costs.

While in the above embodiments the number of the stages of the delay circuits are 4 to 6, the invention is not limited to this.

The reference pulse input terminal 19, the operation mode input terminal 20, and the write terminal 22 may serve as another normal terminal, which may be switched based on the operation mode signal m.

In the above embodiments, the output from one PROM 17 is connected to a set of the delay circuits 12a to 12d and the selector switch 14. To set a plurality of internal outputs to the same delay time, the output from one PROM 17 may be supplied in common to a plurality of sets of the delay circuits 12a to 12d and the selector switches 14.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A semiconductor device for setting a delay time, comprising:
   a frequency divider receiving as an input a reference pulse signal, the frequency divider providing as an output a divided reference signal having a frequency one-half of a frequency of the reference pulse signal;
   a counter receiving as an input the reference pulse signal, wherein an output of the counter changes once per period of the reference pulse signal;
   a plurality of serially connected delay circuits receiving as an input the divided reference signal and having a plurality of delayed outputs representing different delay values; and
   a selector switch for selecting one of the delayed outputs, the selector switch receiving as an input the output of the counter, so that changes in the output of the counter result in changes in a selected one of the delayed outputs;
   wherein for each change of a level of the divided reference signal, a different delayed output is selected.

2. A semiconductor device according to claim 1, wherein said selector switch comprises: a plurality of selector contacts connected to the connection points, respectively; and a movable contact connectable to one of said selector contacts depending on the output of the counter.

3. A semiconductor device according to claim 1, further comprising an internal reference signal generator for generating the reference signal.

4. A semiconductor device according to claim 1, further comprising:
   an operation mode input terminal for inputting a test mode signal;
   an output terminal for outputting the delay signal from said delay circuits; and
   a reference pulse input terminal for inputting the reference pulse signal.

5. A semiconductor device according to claim 4, further comprising a write terminal for inputting a write signal specifying at least one of the delay circuits which produces the delay signal selected by said selector switch.

6. The semiconductor device for setting a delay time of claim 1, wherein the counter, selector switch, and delay circuits are arranged so that successive values of the output of the counter result in successively greater delay values from the selected delayed outputs.

7. A method for setting a delay time of a semiconductor device, comprising the steps of:
   inputting a reference signal, obtained by equally dividing a reference pulse signal, to a plurality of serially connected delay circuits;
   selecting one of the delay signals output from said delay circuits;
   measuring the delay time of the selected delay signal when a predetermined reference delay time has passed;
   determining which delay signal satisfies the predetermined reference delay time based on the measurement; and
   writing information specifying a connection point between the delay circuits in a storage device based on the determination.

8. A method according to claim 7, further comprising the step of repeating the step of inputting a predetermined reference signal to the step of determining which delay signal satisfies the reference delay time.

9. A method according to claim 8, further comprising the step of terminating the repetition of steps when the measurements for two successive pulses of the reference pulse signal yield the same result.

10. A method according to claim 9, further comprising the step of writing the number of said pulses of the reference pulse signal, produced until the measurements for two successive said pulses of the reference pulse signal yield the same results, in said storage device so that the set delay time exceeds the predetermined reference delay time.

11. A method according to claim 9, further comprising the steps of:
   subtracting 1 from the number of said pulses of the reference pulse signal produced until the measurements for two successive said pulses of the reference pulse signal yield the same result; and
   writing the value obtained from the subtraction in said storage device so that the set delay time is within the predetermined reference delay time.

12. A method according to claim 9, further comprising the step of writing a counting umber in said storage device, the counting number being obtained by a counter for counting the number of pulses of the reference pulse signal.

13. A computer readable medium containing program instructions for connecting stations using a local area network interface device having lines for transmitting and receiving a signal to and from a station via a connection port, the program instructions including instructions for performing the steps comprising:

inputting a reference signal, obtained by equally dividing a reference pulse signal, to a plurality of serially connected delay circuits;

selecting one of the delay signals output from said delay circuits;

measuring the delay time of the selected delay signal when a predetermined reference delay time has passed;

determining which delay signal satisfies the predetermined reference delay time based on the measurement; and writing information specifying a connection point between the delay circuits in a storage device based on the determination.

14. A computer readable medium according to claim 13, wherein the program instructions include instructions for performing the step of repeating the step of inputting a reference signal to the step of determining which delay signal satisfies the predetermined reference delay time.

15. A computer readable medium according to claim 14, wherein the program instructions include instructions for performing the step of terminating the repetition of steps when the measurements for two successive pulses of the reference pulse signal yield the same result.

16. A computer readable medium according to claim 15, wherein the program instructions include instructions for performing the step of writing the number of said pulses of the reference pulse signal, produced until the measurements for two successive pulses of the reference pulse signal yield the same result, in said storage device so that the set delay time exceeds the predetermined reference delay time.

17. A computer readable medium according to claim 15, wherein the program instructions include instructions for performing the steps of:

subtracting 1 from the number of the pulses of the reference pulse signal, produced until the measurements for two successive said pulses of the reference pulse signal yield the same result; and writing a value, obtained from the subtraction, in said storage device so that the set delay time is within the predetermined reference delay time.

18. A computer readable medium according to claim 13, wherein the program instructions include instructions for performing the step of writing a counting number in said storage device, the counting number being obtained by a counter for counting pulses of the reference pulse signal.

* * * * *